(12) United States Patent
Fujii

(10) Patent No.: US 10,446,645 B2
(45) Date of Patent: Oct. 15, 2019

(54) SEMICONDUCTOR DEVICE AND METHOD OF MANUFACTURING THE SAME

(71) Applicant: ASAHI KASEI MICRODEVICES CORPORATION, Tokyo (JP)

(72) Inventor: Shuntaro Fujii, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 0 days.

(21) Appl. No.: 15/913,139

(22) Filed: Mar. 6, 2018

(65) Prior Publication Data

US 2018/0286950 A1 Oct. 4, 2018

(30) Foreign Application Priority Data

Mar. 29, 2017 (JP) ................................. 2017-064970

(51) Int. Cl.
*H01L 21/28* (2006.01)
*H01L 21/74* (2006.01)
(Continued)

(52) U.S. Cl.
CPC ...... *H01L 29/1041* (2013.01); *H01L 21/2253* (2013.01); *H01L 21/26513* (2013.01); *H01L 21/28052* (2013.01); *H01L 21/28518* (2013.01); *H01L 21/324* (2013.01); *H01L 21/74* (2013.01); *H01L 29/1083* (2013.01);
(Continued)

(58) Field of Classification Search
CPC ........... H01L 29/66575; H01L 21/2253; H01L 29/1041; H01L 29/42376; H01L 29/1083; H01L 21/28518; H01L 21/74; H01L 29/66537; H01L 21/324; H01L 29/4933; H01L 21/26513; H01L 29/167;
(Continued)

(56) References Cited

U.S. PATENT DOCUMENTS 5,196,908 A 3/1993 Kusunoki et al.
5,710,055 A * 1/1998 Kizilyalli ............ H01L 21/2652
438/289

(Continued)

FOREIGN PATENT DOCUMENTS

JP H03-209876 A 9/1991
JP H05-211331 A 8/1993
(Continued)

*Primary Examiner* — Jasmine J Clark
(74) *Attorney, Agent, or Firm* — Morgan, Lewis & Bockius LLP

(57) ABSTRACT

A semiconductor device 1 includes: a well region 5 provided on a surface layer of a semiconductor substrate 2; a source region 14S and a drain region 15D disposed to be distant from each other on the surface layer of the well region 5; a channel region 6 provided between the source region 14S and the drain region 15D; and a gate electrode 8 provided over the channel region 6 with a gate insulator 7 interposed therebetween. A gate length of the gate electrode 8 is 1.5 µm or less, the channel region 6 includes indium as a channel impurity, a distance between a surface of the channel region 6 and a concentration peak position of the channel impurity is 20 nm to 70 nm, and a concentration of the channel impurity gradually decreases in a direction from the concentration peak position of the channel impurity to the surface of the channel region.

11 Claims, 10 Drawing Sheets

(51) Int. Cl.
   *H01L 29/10*  (2006.01)
   *H01L 29/49*  (2006.01)
   *H01L 29/66*  (2006.01)
   *H01L 29/78*  (2006.01)
   *H01L 21/225*  (2006.01)
   *H01L 21/265*  (2006.01)
   *H01L 21/285*  (2006.01)
   *H01L 21/324*  (2006.01)
   *H01L 29/167*  (2006.01)
   *H01L 29/423*  (2006.01)

(52) U.S. Cl.
   CPC ...... *H01L 29/167* (2013.01); *H01L 29/42376* (2013.01); *H01L 29/6659* (2013.01); *H01L 29/66537* (2013.01); *H01L 29/66575* (2013.01); *H01L 29/7833* (2013.01); *H01L 29/4933* (2013.01); *H01L 29/665* (2013.01)

(58) Field of Classification Search
   CPC ............. H01L 29/665; H01L 21/28052; H01L 29/7833; H01L 29/6659
   See application file for complete search history.

(56) References Cited

U.S. PATENT DOCUMENTS

| | | | |
|---|---|---|---|
| 6,144,079 | A | 11/2000 | Shirahata et al. |
| 2001/0009292 | A1* | 7/2001 | Nishinohara ... H01L 21/823807 257/402 |
| 2002/0006693 | A1 | 1/2002 | Matsuda |
| 2003/0008462 | A1 | 1/2003 | Horiuchi et al. |
| 2004/0188767 | A1 | 9/2004 | Weber et al. |
| 2006/0139821 | A1 | 6/2006 | Nishimuta et al. |

FOREIGN PATENT DOCUMENTS

| | | |
|---|---|---|
| JP | H08-186253 A | 7/1996 |
| JP | 2002-033477 A | 1/2002 |
| JP | 2002-368212 A | 12/2002 |
| JP | 2004-119860 A | 4/2004 |
| JP | 2007-048882 A | 2/2007 |
| JP | 2014-140025 A | 7/2014 |
| JP | 2016-004952 A | 1/2016 |

* cited by examiner

SEMICONDUCTOR DEVICE AND METHOD OF MANUFACTURING THE SAME

BACKGROUND OF THE INVENTION

Field of the Invention

The present invention relates to a semiconductor device and a method of manufacturing the same and particularly relates to a technology that is useful for a semiconductor device including an insulated gate field effect transistor that constitutes an analog circuit and a method of manufacturing the same.

Description of the Related Art

In an analog circuit that is mounted on a semiconductor device, for example, a MOSFET is used as an insulated gate field effect transistor. In order to realize high performance of an analog circuit, it is effective to reduce a 1/f noise of a MOSFET. In order to reduce a 1/f noise of a MOSFET, it is known that, for example, the following methods are effective: (1) a method of reducing an interface state density between a gate insulator and a silicon substrate; (2) a method of reducing an impurity concentration in a channel region in both a depth direction and a horizontal direction; (3) a method of reducing a variation in a work function of a gate electrode; and (4) a method of reducing a parasitic resistance.

As the method of reducing an interface state density, PTL 1 discloses a method including: forming a polysilicon film that forms a gate electrode; and then performing additional lamp annealing on the formed polysilicon film (hereinafter, referred to as "additional lamp annealing").

CITATION LIST

Patent Literature

PTL 1: JP 2016-4952 A

SUMMARY OF THE INVENTION

However, the present inventors found that the method of additional lamp annealing has an unfavorable effect on "(2) the method of reducing an impurity concentration in a channel region in both a depth direction and a horizontal direction". As a channel impurity ion for forming a channel region of an n-channel MOSFET, a boron difluoride ion ($BF_2^+$) is used in many cases. FIG. 17 illustrates the results of a simulation of investigating a depth-direction concentration distribution of boron in a channel region depending on whether or not additional lamp annealing is performed. Here, additional lamp annealing is performed under conditions of 1100° C. and 60 seconds. In the drawing, C1 represents data in a case where additional lamp annealing is not performed, and C2 represents data in a case where additional lamp annealing is performed.

As illustrated in FIG. 17, it can be seen that a boron concentration in an interface between a gate insulator and a silicon substrate (a surface of the silicon substrate in contact with the gate insulator: gate insulator/Si interface) increases due to additional lamp annealing (data C2). In addition, a horizontal-direction concentration distribution of boron is affected by impurity ion implantation during formation of an extension region and source and drain regions. Interstitial silicon (Si) is emitted in the silicon substrate by the impurity ion implantation, and then transient enhanced diffusion (TED) occurs due to activation annealing. As a result, boron segregates at an edge of each of a source region and a drain region (an edge of an extension region). As overlapping between a boron distribution and an interstitial silicon distribution in a channel region increases, TED of a boron ion is likely to occur.

In order to further obtain a noise reduction effect by additional lamp annealing, it is necessary that boron as a channel impurity for forming a channel region is diffused in the vicinity of an interface between a gate insulator and a silicon substrate to prevent easy occurrence of TED.

An object of the present invention is to provide a technology capable of reducing a 1/f noise of an insulated gate field effect transistor.

In order to achieve the object, according to an aspect of the present invention, there is provided a semiconductor device including: a well region provided on a surface layer of a semiconductor substrate; a source region and a drain region disposed to be distant from each other on a surface layer of the well region; a channel region provided between the source region and the drain region; and a gate electrode provided over the channel region with a gate insulator interposed between the gate electrode and the channel region. A gate length of the gate electrode is 1.5 µm or less, the channel region includes indium as a channel impurity, and a distance between a surface of the channel region and a concentration peak position of the channel impurity is 20 nm to 70 nm. In addition, a concentration distribution of the channel impurity gradually decreases in a direction from the concentration peak position of the channel impurity to the surface of the channel region.

In addition, in order to achieve the object, according to another aspect of the present invention, there is provided a method of manufacturing a semiconductor device including: ion-implanting a well impurity into a surface layer of a semiconductor substrate; implanting an indium ion as a channel impurity ion into the surface layer of the semiconductor substrate; performing a first heat treatment on the semiconductor substrate into which the well impurity ion and the indium ion have been implanted; forming a gate insulator on the surface of the semiconductor substrate on which the first heat treatment have been performed; forming a polysilicon film on the gate insulator; performing a second heat treatment on the semiconductor substrate on which the polysilicon film has been formed after the formation of the polysilicon film; and forming a gate electrode having an gate length of 1.5 µm or less by implanting a gate impurity ion into the polysilicon film, patterning the polysilicon film, and performing a third heat treatment on the semiconductor substrate.

According to the aspects of the present invention, a 1/f noise of an insulated gate field effect transistor can be reduced.

DESCRIPTION OF THE PREFERRED EMBODIMENTS

Figure 1:
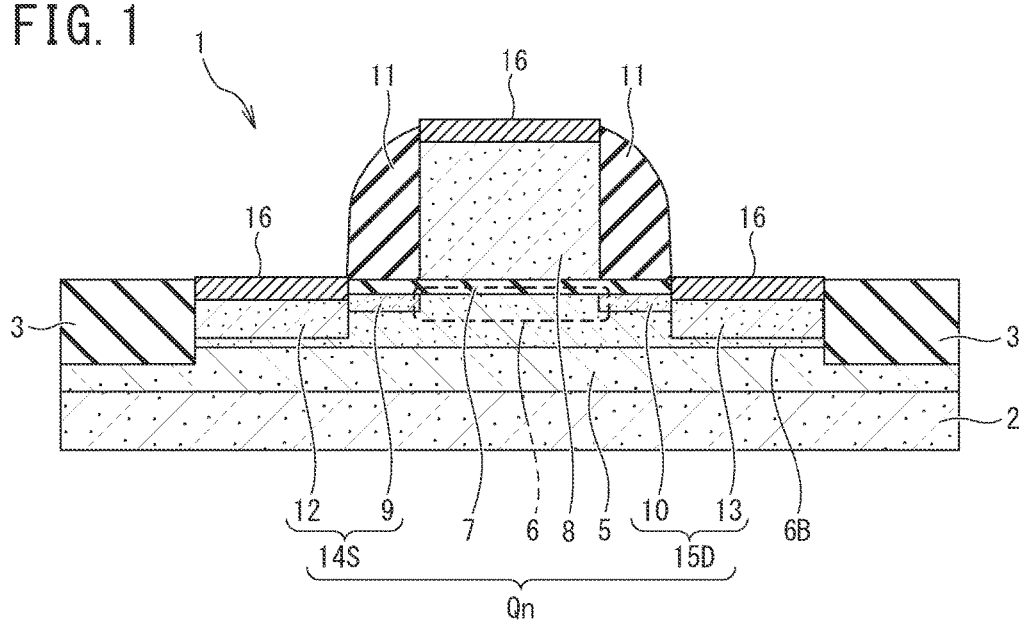
FIG. 1 is a cross-sectional view illustrating a schematic configuration of major components of a semiconductor device according to an embodiment of the present invention.

Hereinafter, an embodiment of the present invention will be described in detail with reference to the drawings. In all the drawings for describing the embodiment of the present invention, components having the same function are represented by the same reference numeral, and the description thereof will not be repeated.

In addition, in order to easily understand the drawing, FIG. 1 does not illustrate an interlayer dielectric or wiring on a silicon substrate.

In addition, in the following embodiment, an example in which the present invention is applied to a semiconductor device will be described, the semiconductor device including a metal oxide semiconductor field effect transistor (MOSFET) in which a gate insulator is formed of a silicon oxide film as an insulated gate field effect transistor.

(Schematic Configuration of Semiconductor Device)

First, a schematic configuration of a semiconductor device 1 according to an embodiment of the present invention will be described using FIG. 1.

As illustrated in FIG. 1, the semiconductor device 1 according to the embodiment of the present invention includes, for example, a single-crystal silicon substrate 2 as a semiconductor substrate. The silicon substrate 2 is a first conductivity type (n-type) substrate or a second conductivity type (p-type) substrate including a deep N-well. In addition, the semiconductor device 1 includes, for example, a n-channel MOSFET-Qn as an insulated gate field effect transistor constituting an analog circuit. MOSFET-Qn is provided in an element-forming region of a surface layer of the silicon substrate 2. The element-forming region of the silicon substrate 2 is partitioned by an element isolation layer 3 provided in an element isolation region of the surface layer of the silicon substrate 2, and is insulated and isolated from another element-forming region. The element isolation layer 3 is not particularly limited and is formed by, for example, a well-known shallow trench isolation (STI) technology. The element isolation layer 3 using the STI technology can be formed by forming a shallow trench (a trench having a depth of, for example, about 400 nm) on the element isolation region of the surface layer of the silicon substrate 2, forming an element isolation insulating film formed of, for example, a silicon oxide film on the entire area of the surface layer of the silicon substrate 2 using a chemical vapor deposition (CVD) method, and planarizing the element isolation insulating film using a chemical mechanical polishing (CMP) method so as to selectively remain in the shallow trench. The element isolation layer 3 can also be formed using a local oxidation of silicon (LOCOS) method.

In the element-forming region of the surface layer of the silicon substrate 2, a second conductivity type (p-type) well region 5 is provided, and the MOSFET-Qn is provided on a surface layer of the well region 5.

The MOSFET-Qn includes: a source region 14S and a drain region 15D disposed to be distant from each other on the surface layer of the well region 5; a channel region 6 provided between the source region 14S and the drain region 15D; and a gate electrode 8 provided over the channel region 6 with a gate insulator 7 interposed therebetween.

The source region 14S is configured to include an n-type extension region 9 and an n-type contact region (deep source region) 12. The drain region 15D is configured to include an n-type extension region 10 and an n-type contact region (deep drain region) 13. The extension regions 9 and 10 are formed to match with the gate electrode 8. The contact regions 12 and 13 are formed to match with a side wall spacer 11 that is provided on a side surface of the gate electrode 8. In order to reduce a short channel effect and to reduce parasitic resistance, the extension regions 9 and 10 are formed with a high impurity concentration in a shallower region than the contact regions 12 and 13. In order to reduce contact resistance with wiring connected to the source region and the drain region, the contact regions 12 and 13 are formed with a higher impurity concentration than the extension regions 9 and 10.

The channel region 6 is a region provided between the source region and the drain region in a channel impurity layer 6B provided on the surface layer of the well region 5. In order to adjust a threshold voltage Vth of the MOSFET-Qn, the channel impurity layer 6B is formed of a channel impurity ion implanted into the surface layer of the silicon substrate 2. As the channel impurity ion, an impurity ion having a higher mass (having a lower diffusion coefficient) than a boron ion ($B^+$) or a boron difluoride ion ($BF_2^+$) exhibiting p-type, for example, an indium ion (Ink) is used. That is, the channel region 6 includes indium. The channel region 6 is controlled by a voltage applied to the gate electrode 8 such that a channel (current path) that electrically connects the source region 14S and the drain region 15D to each other is formed.

For example, the gate insulator 7 is formed of a silicon dioxide ($SiO_2$) film using a thermal oxidation method. As the gate insulator 7, for example, a silicon oxynitride film (SiON), a silicon nitride film ($Si_3N_4$), or a high-dielectric insulating film formed using an atomic layer deposition (ALD) method can also be used. In particular, in an insulated gate field effect transistor in which a low 1/f noise is required, it is preferable that a silicon dioxide film having a low interface state density is used.

The gate electrode 8 is formed of, for example, a polysilicon film, and a gate impurity ion for reducing a resistance value, for example, a phosphorus ion ($P^+$) or an arsenic ion ($As^+$) is implanted into the polysilicon film after formation.

A silicide layer (metal/semiconductor reaction layer) 16 is provided on a surface of each of the gate electrode 8 and the contact regions 12 and 13. The silicide layer 16 is formed to match with the side wall spacer 11, for example, using a silicide technology. As the silicide layer 16, for example, cobalt silicide ($CoSi_2$), titanium silicide ($TiSi_2$), nickel silicide ($NiSi_2$) and the like can be used.

Here, although the detailed description will be made below, a gate length of the gate electrode 8 is 1.5 μm or less, preferably 1.0 μm or less, and more preferably 0.5 μm or less. In addition, the distance between a surface of the channel region 6 (an interface between the silicon substrate 2 and the gate insulator 7) and a peak position of an impurity concentration distribution in the channel region 6 is 20 nm to 70 nm. An interface state density of the channel region 6 is $3.0 \times 10^9$ cm$^{-2}$ or higher and lower than $1.0 \times 10^{10}$ cm$^{-2}$. In an indium impurity concentration distribution in the channel region 6, the indium impurity concentration gradually decreases in a direction from the concentration peak position of the channel impurity to the surface of the channel region 6. On the other hand, in a case where extension implantation is performed, interstitial silicon has a concentration peak in the vicinity of the surface of the channel region 6, and is distributed at a depth corresponding to acceleration energy of extension implantation. The distribution of interstitial silicon is substantially the same as the distribution of impurity (arsenic) in the extension regions 9 and 10. Regarding the acceleration energy during extension impurity ion implantation described below, the extension impurity and the interstitial silicon have a concentration peak in the vicinity of the surface of the channel region 6, and are distributed in a region of a depth of 20 nm to 50 nm from the surface of the channel region 6.

Therefore, by adjusting the concentration peak position of indium in the channel region 6 to be 20 nm to 70 nm, overlapping between the channel impurity (indium) distribution and the interstitial silicon distribution in the channel region 6 decreases, and TED is suppressed.

(Method of Manufacturing Semiconductor Device)

Next, a method of manufacturing the semiconductor device 1 according to the embodiment of the present invention will be described using FIGS. 2 to 12.

First, the silicon substrate 2 is prepared as a semiconductor substrate.

Figure 2:
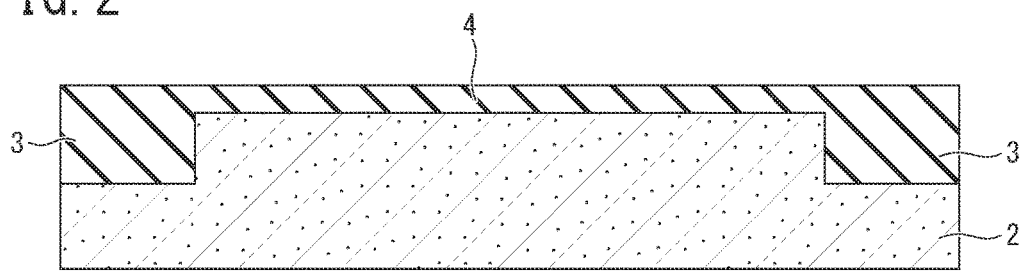
FIG. 2 is a cross-sectional view illustrating major parts to describe a method of manufacturing the semiconductor device according to the embodiment of the present invention.

Next, as illustrated in FIG. 2, the element isolation layer 3 that partitions the element-forming region of the surface layer of the silicon substrate 2 is formed. The element isolation layer 3 is formed by, for example, a well-known STI technology.

Next, as illustrated in FIG. 2, a through film 4 formed of a silicon oxide film is formed on the element-forming region of the surface layer of the silicon substrate 2 using, for example, a thermal oxidation method.

Figure 3:
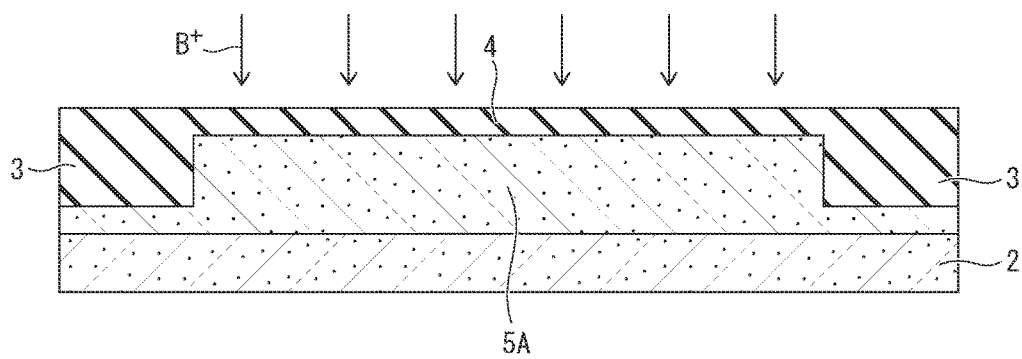
FIG. 3 is a cross-sectional view illustrating major parts to describe the method of manufacturing the semiconductor device according to the embodiment of the present invention.

Next, as illustrated in FIG. 3, for example, a boron ion ($B^+$) exhibiting p-type conductivity as a well impurity ion is selectively implanted into the element-forming region of the surface layer of the silicon substrate 2 through the through film 4. The implantation of the boron ion ($B^+$) is performed, for example, under conditions of dosage: about $1 \times 10^{12}$ cm$^{-2}$ to $1 \times 10^{13}$ cm$^{-2}$ and acceleration energy: about 30 keV to 60 keV. In this step, as illustrated in FIG. 3, a well impurity ion implantation region 5A formed of the boron ion is formed on the surface layer of the silicon substrate 2.

Figure 4:
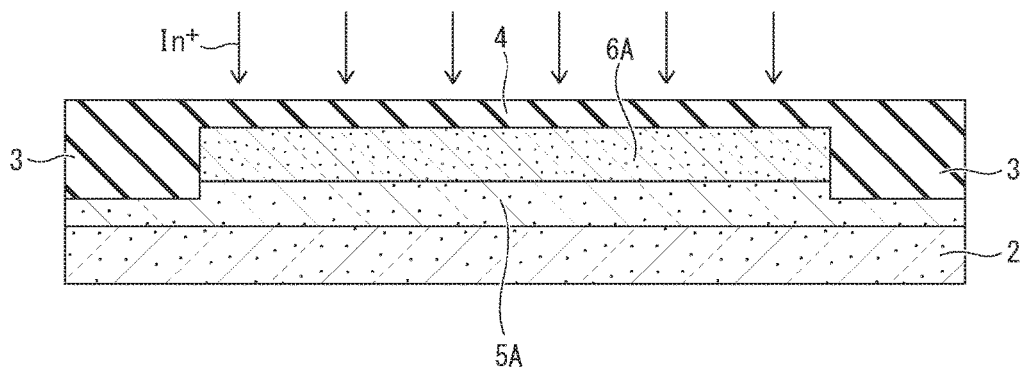
FIG. 4 is a cross-sectional view illustrating major parts to describe the method of manufacturing the semiconductor device according to the embodiment of the present invention.

Next, as illustrated in FIG. 4, an indium ion (Ink) exhibiting p-type conductivity as a channel impurity ion for adjusting the threshold voltage of the MOSFET-Qn is selectively implanted into the element-forming region of the surface layer of the silicon substrate 2 through the through film 4. The implantation of the indium ion (Ink) is performed, for example, under conditions of dosage: about $1 \times 10^{12}$ cm$^{-2}$ to $1 \times 10^{14}$ cm$^{-2}$ and acceleration energy: about 80 keV to 120 keV. In this step, as illustrated in FIG. 4, a channel impurity ion implantation region 6A formed of the indium ion is formed on the surface layer of the silicon substrate 2. The channel impurity ion implantation region 6A is formed to be shallower than the well impurity ion implantation region 5A.

Figure 5:
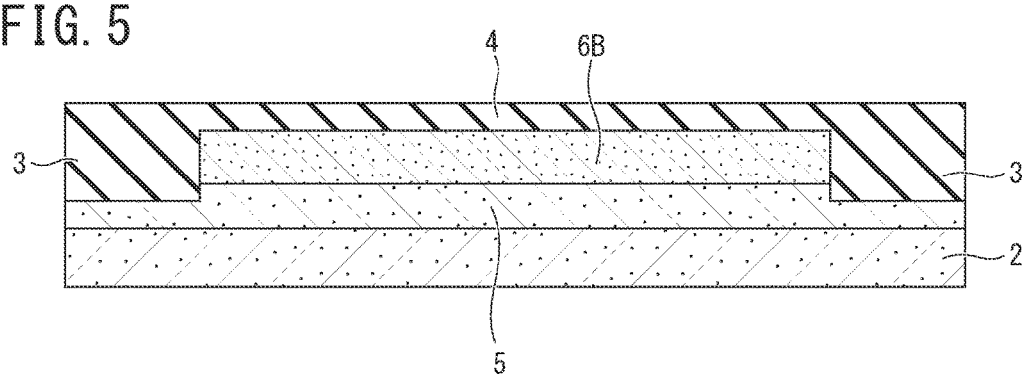
FIG. 5 is a cross-sectional view illustrating major parts to describe the method of manufacturing the semiconductor device according to the embodiment of the present invention.

Next, activation annealing as a first heat treatment for activating the boron ion and the indium ion is performed on the silicon substrate 2 into which the boron ion as the well impurity ion and the indium ion as the channel impurity ion are implanted. In this step, as illustrated in FIG. 5, the p-type well region 5 is formed on the well impurity ion implantation region 5A into which the boron ion as the well impurity ion is implanted. In addition, the p-type channel impurity layer 6B used as the channel region is formed on the channel impurity ion implantation region 6A into which the indium ion as the channel impurity ion is implanted. The channel impurity layer 6B is formed to be shallower than the well region 5.

Figure 6:
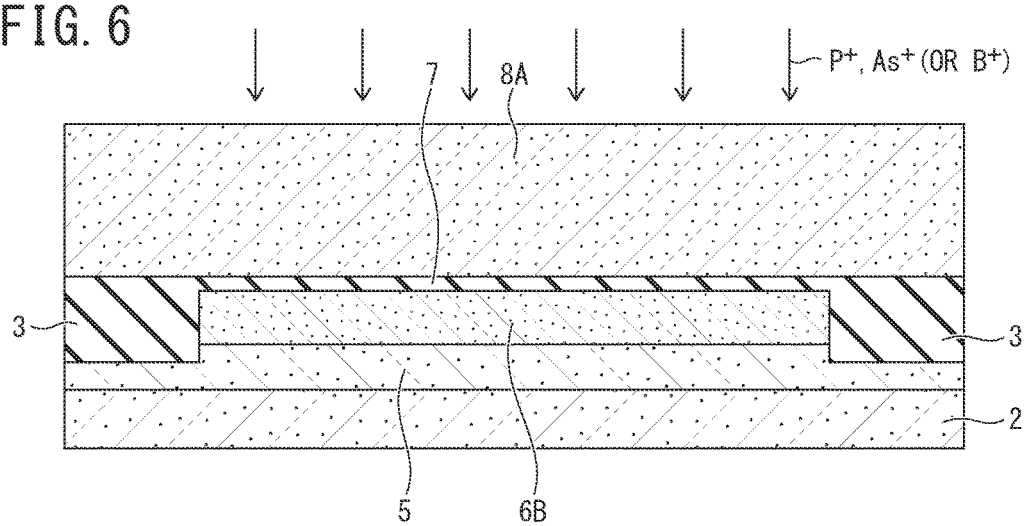
FIG. 6 is a cross-sectional view illustrating major parts to describe the method of manufacturing the semiconductor device according to the embodiment of the present invention.

Next, after removing the through film 4, as illustrated in FIG. 6, the gate insulator 7 formed of a silicon dioxide film is formed on the element-forming region of the surface layer of the silicon substrate 2 using a thermal oxidation method.

Next, as illustrated in FIG. 6, a non-doped polysilicon film 8A as a gate material is formed on the entire area of the surface layer of the silicon substrate 2 including the gate insulator 7 using a CVD method.

Here, in a case where the polysilicon film 8A is deposited as the gate material of the gate electrode 8, it is necessary that the polysilicon film 8A is a non-doped polysilicon film in which the concentration of each of a donor element and an acceptor element is a detection limit value or lower (for example, each impurity concentration is $1 \times 10^{16}$ cm$^{-3}$ or lower; ideally zero). The reason for this is that there may be adverse effects. For example, in a case where an acceptor element or the like is present in the polysilicon film 8A as the gate material, due to a high-temperature heat treatment in the next step, the acceptor element or the like may seep out from the polysilicon film 8A to the gate insulator 7 or the silicon substrate 2, and the threshold Vth of the MOSFET-Qn changes. That is, "non-doped polysilicon film" described in the embodiment refers to a silicon film in which a gate impurity for doping is not doped during deposition of the film or into which a gate impurity is not implanted.

Next, after forming the polysilicon film 8A, high-temperature additional annealing as a second heat treatment is performed on the silicon substrate 2 on which the polysilicon film 8A have been formed. The additional annealing is performed by, for example, rapid thermal annealing (RTA). In other words, the additional annealing is performed in a non-doped state in which the gate impurity is not implanted into the non-doped polysilicon film. In addition, the additional annealing is performed, for example, in a mixed gas atmosphere including nitrogen (N$_2$) and oxygen (O$_2$). In this step, the additional annealing is performed under conditions of annealing temperature: 965° C. to 1125° C. and annealing time: 15 seconds to 60 seconds. As a result, the interface state density in the gate insulator 7 can be reduced, and the 1/f noise can be effectively reduced.

Next, after performing the additional annealing on the silicon substrate 2, as illustrated in FIG. 6, the gate impurity ion is implanted into the entire area of the polysilicon film 8A. As the gate impurity ion, a donor element ion exhibiting n-type conductivity such as a phosphorus ion (P$^+$) or an arsenic ion (As$^+$), or an acceptor element ion exhibiting p-type conductivity such as a boron ion (B$^+$) is used. According to the purpose, the donor element ion or the acceptor element ion may be separately implanted. The implantation of the gate impurity ion is performed after the additional annealing. Therefore, the seeping of the gate impurity from the polysilicon film 8A as the gate material to the silicon substrate 2 side does not occur, and depletion of the gate electrode that has an adverse effect on the 1/f noise of the MOSFET-Qn can be suppressed.

Figure 7:
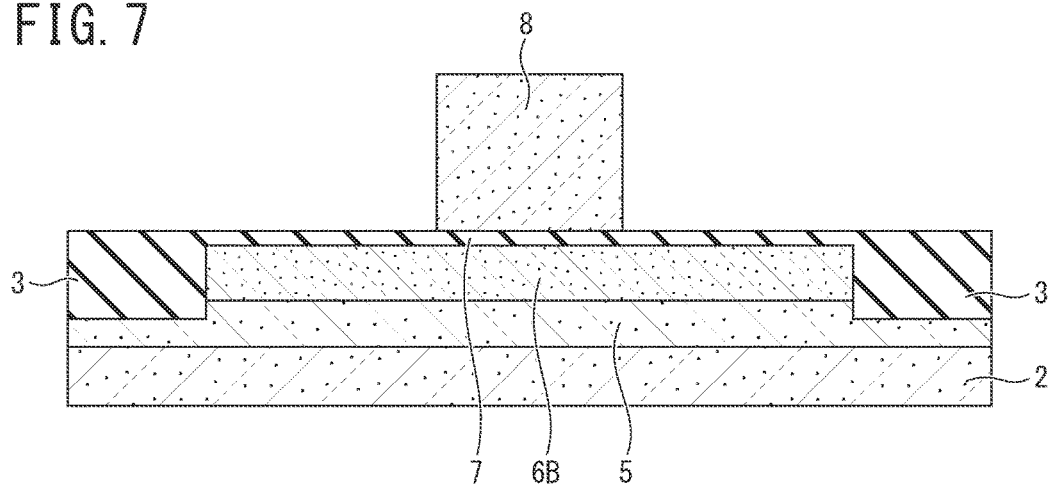
FIG. 7 is a cross-sectional view illustrating major parts to describe the method of manufacturing the semiconductor device according to the embodiment of the present invention.

Next, the polysilicon film 8A into which the gate impurity is implanted is patterned such that an gate length thereof is 1.5 μm or less. In order to prevent deterioration of reliability caused by electric field concentration on a gate electrode edge, as a third heat treatment, for example, reoxidation is performed in a mixed gas atmosphere including nitrogen and oxygen at 850° C. for 40 minutes. In this reoxidation step, conditions are set such that the gate impurity in the polysilicon film 8A does not seep out to the silicon substrate 2 side. In this step, as illustrated in FIG. 7, the gate electrode 8 formed of the polysilicon film 8A into which the gate impurity is implanted is formed on the gate insulator 7.

Figure 8:
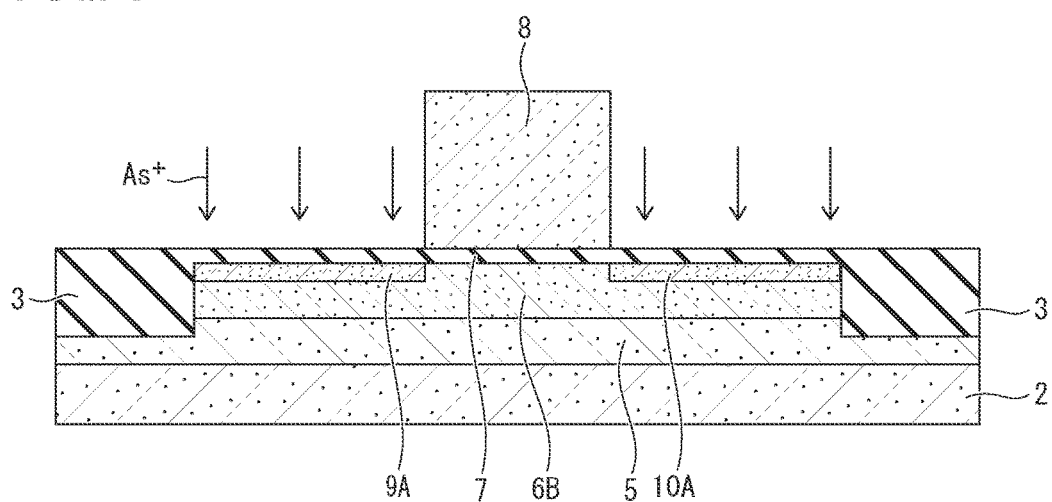
FIG. 8 is a cross-sectional view illustrating major parts to describe the method of manufacturing the semiconductor device according to the embodiment of the present invention.

Next, as illustrated in FIG. 8, the extension impurity ion, for example, an arsenic ion (As$^+$) exhibiting n-type conductivity is selectively implanted into the element-forming region of the surface layer of the silicon substrate 2 by using the gate electrode 8 as a mask. The implantation of the arsenic ion is performed, for example, under conditions of dosage: about $5 \times 10^{14}$ cm$^{-2}$ to $2 \times 10^{15}$ cm$^{-2}$ and acceleration energy: about 3 keV to 10 keV. In this step, as illustrated in FIG. 8, extension impurity ion implantation regions 9A and 10A formed of the arsenic ion are formed on the surface layer of the silicon substrate 2.

Figure 9:
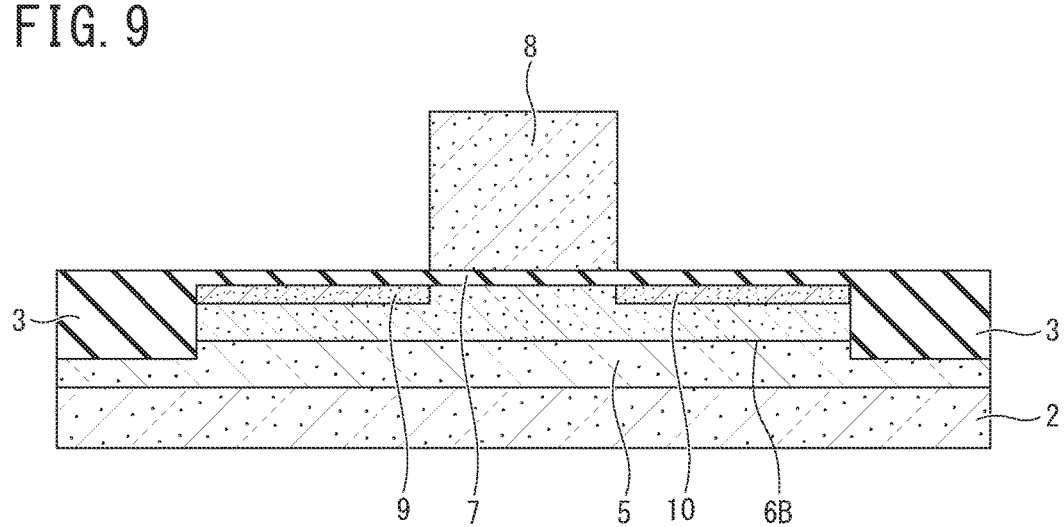
FIG. 9 is a cross-sectional view illustrating major parts to describe the method of manufacturing the semiconductor device according to the embodiment of the present invention.

Next, activation annealing as a fourth heat treatment for activating the arsenic ion is performed on the silicon substrate 2 into which the arsenic ion as the extension impurity ion is implanted. In this step, as illustrated in FIG. 9, the n-type extension regions 9 and 10 are formed on the extension impurity ion implantation regions 9A and 10A into which the arsenic ion as the extension impurity ion is implanted. The extension regions 9 and 10 are formed on the surface layer of the channel impurity layer 6B to match with the gate electrode 8.

Here, arsenic as the extension impurity is slightly diffused in a depth direction and in a horizontal direction due to the activation annealing. Therefore, the distance between the extension region 9 and the extension region 10 is shorter than the gate length of the gate electrode 8. The distance between the extension regions 9 and 10 is an effective gate length of the MOSFET-Qn, and is shorter than a physical gate length Lg of the MOSFET-Qn by about 20 nm.

Figure 10:
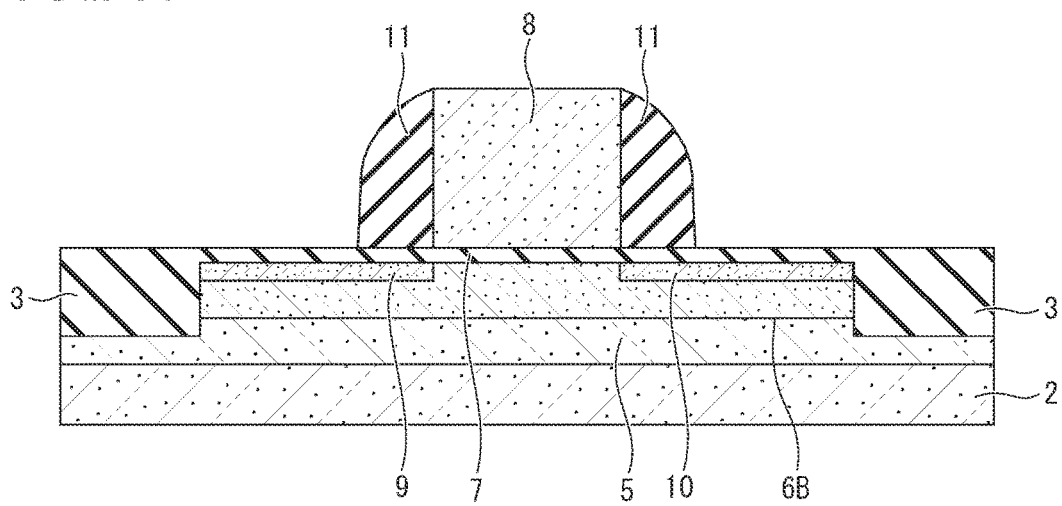
FIG. 10 is a cross-sectional view illustrating major parts to describe the method of manufacturing the semiconductor device according to the embodiment of the present invention.

Next, as illustrated in FIG. 10, the side wall spacer 11 is formed on the side surface of the gate electrode 8. The side wall spacer 11 is formed by forming an insulating film formed of, for example, a silicon oxide film or a silicon nitride film on the entire area of the surface layer of the silicon substrate 2 including the gate electrode 8 using a CVD method, and then performing anisotropic etching such as reactive ion etching (RIE) on the insulating film. The side wall spacer 11 is formed to match with the gate electrode 8.

Figure 11:
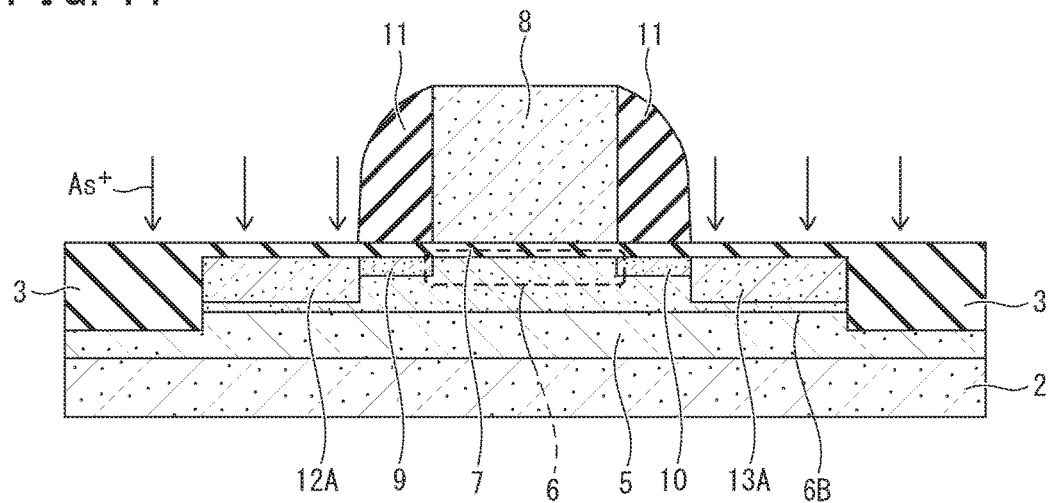
FIG. 11 is a cross-sectional view illustrating major parts to describe the method of manufacturing the semiconductor device according to the embodiment of the present invention.

Next, as illustrated in FIG. 11, the contact impurity ion, for example, an arsenic ion (As$^+$) exhibiting n-type conductivity is selectively implanted into the element-forming region of the surface layer of the silicon substrate 2 by using the gate electrode 8 and the side wall spacer 11 as a mask. The implantation of the arsenic ion is performed, for example, under conditions of dosage: about $1 \times 10^{15}$ cm$^{-2}$ to $1 \times 10^{16}$ cm$^{-2}$ and acceleration energy: about 40 keV to 100 keV. In this step, as illustrated in FIG. 11, contact impurity ion implantation regions 12A and 13A formed of the arsenic ion are formed on the surface layer of the silicon substrate 2.

Figure 12:
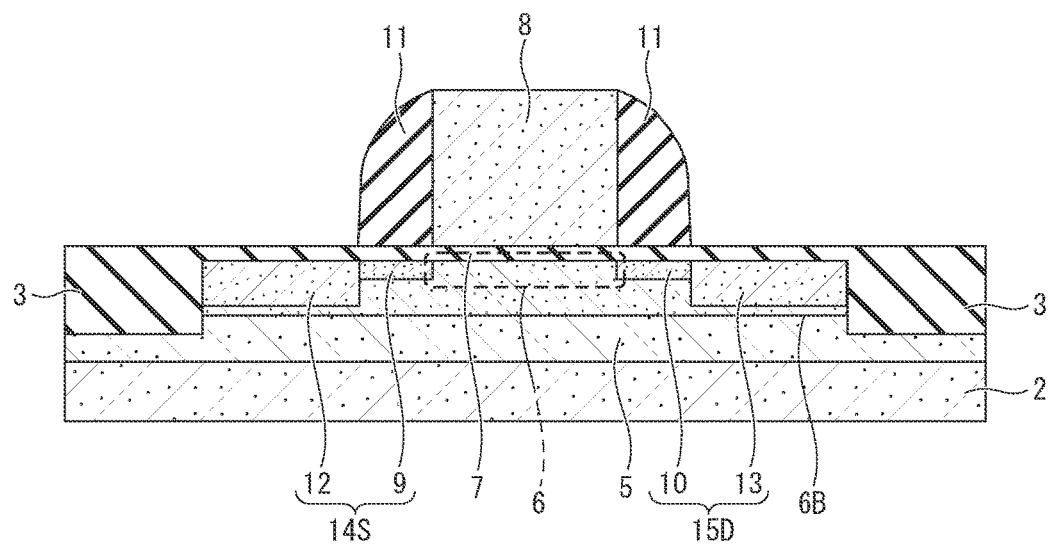
FIG. 12 is a cross-sectional view illustrating major parts to describe the method of manufacturing the semiconductor device according to the embodiment of the present invention.

Next, activation annealing as a fifth heat treatment for activating the arsenic ion is performed on the silicon substrate 2 into which the arsenic ion as the contact impurity ion is implanted. In this step, as illustrated in FIG. 12, the n-type contact regions 12 and 13 are formed on the contact impurity ion implantation regions 12A and 13A into which arsenic as the contact impurity is implanted. The contact regions 12 and 13 are formed on the surface layer of the channel impurity layer 6B to match with the side wall spacer 11. In addition, the contact regions 12 and 13 are formed more deeply than the extension regions 9 and 10.

In this step, the source region 14S including the extension region 9 and the contact region 12 is formed, and the drain region 15D including the extension region 10 and the contact region 13 is formed.

Next, the silicide layer 16 is formed on a surface of each of the gate electrode 8 and the contact regions 12 and 13. The silicide layer 16 is formed as follows. A native oxide film is removed to expose a surface of each of the gate electrode 8 and the contact regions 12 and 13, and then a high-melting-point metal film is formed by sputtering on the entire area of the silicon substrate 2 including the surfaces of the gate electrode 8 and the contact regions 12 and 13. Next, silicon of the gate electrode 8 and the contact regions 12 and 13 is caused to react with the metal of the high-melting-point metal film through a heat treatment such that a metal/semiconductor reaction layer is formed. Next, an unreacted portion of the high-melting-point metal film other than the metal/semiconductor reaction layer is selectively removed, and then a structure of the metal/semiconductor reaction layer is stabilized through a heat treatment. As a result, the silicide layer 16 is formed.

In this step, the MOSFET-Qn illustrated in FIG. 1 is substantially completed. In the MOSFET-Qn formed as described above, the channel region 6 between the source region and the drain region includes indium as the channel impurity. The channel region 6 is a region provided between the source region and the drain region in the channel impurity layer 6B.

Next, although not illustrated in the drawing, an interlayer dielectric is formed on the entire area of the silicon substrate 2 including the MOSFET-Qn, a contact hole through which the surface of each of the gate electrode 8, the source region 14S, and the drain region 15D of the MOSFET-Qn is exposed is formed on the interlayer dielectric, and then a conductive plug is embedded in the contact hole. Next, wiring connected to the conductive plug is formed on the interlayer dielectric, and then a protective film is formed on the interlayer dielectric so as to cover the wiring. As a result, the semiconductor device 1 including the MOSFET-Qn that constitutes an analog circuit is substantially completed.

(1/f Noise Characteristics)

Next, 1/f noise characteristics of the n-channel MOSFET-Qn will be described using FIGS. 13 to 17.

Figure 13:
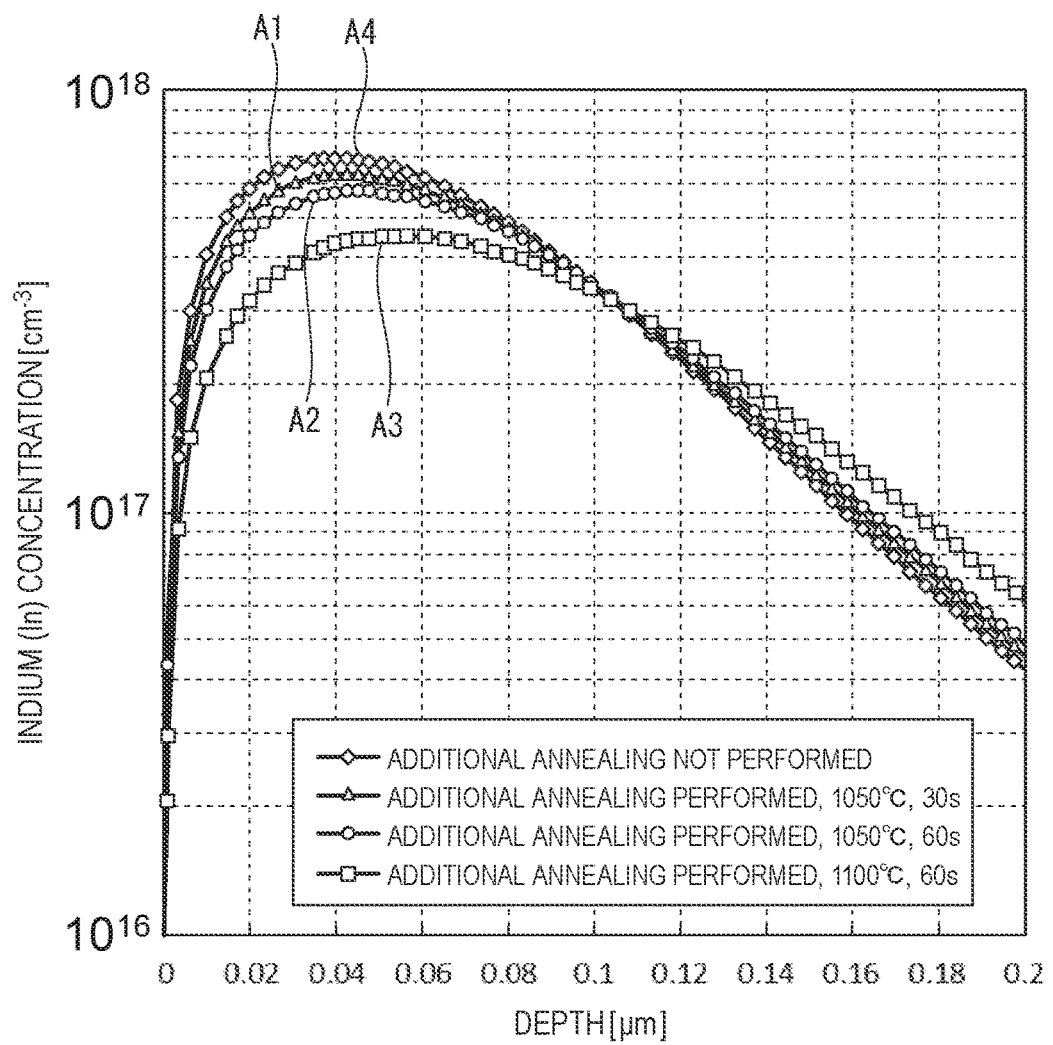
FIG. 13 is a graph illustrating the results of a simulation of investigating a depth-direction concentration distribution of indium in a channel region to describe the semiconductor device according to the embodiment of the present invention and the method of manufacturing the same.

FIG. 13 is a graph illustrating the results of a simulation of investigating a depth-direction concentration distribution of indium in the channel region 6. FIG. 13 illustrates additional annealing conditions of three patterns including: at 1050° C. and for 30 seconds (data A1), at 1050° C. and for 60 seconds (data A2); and at 1100° C. and for 60 seconds (data A3). In addition, FIG. 13 also illustrates a case where additional annealing is not performed (data A4).

Figure 17:
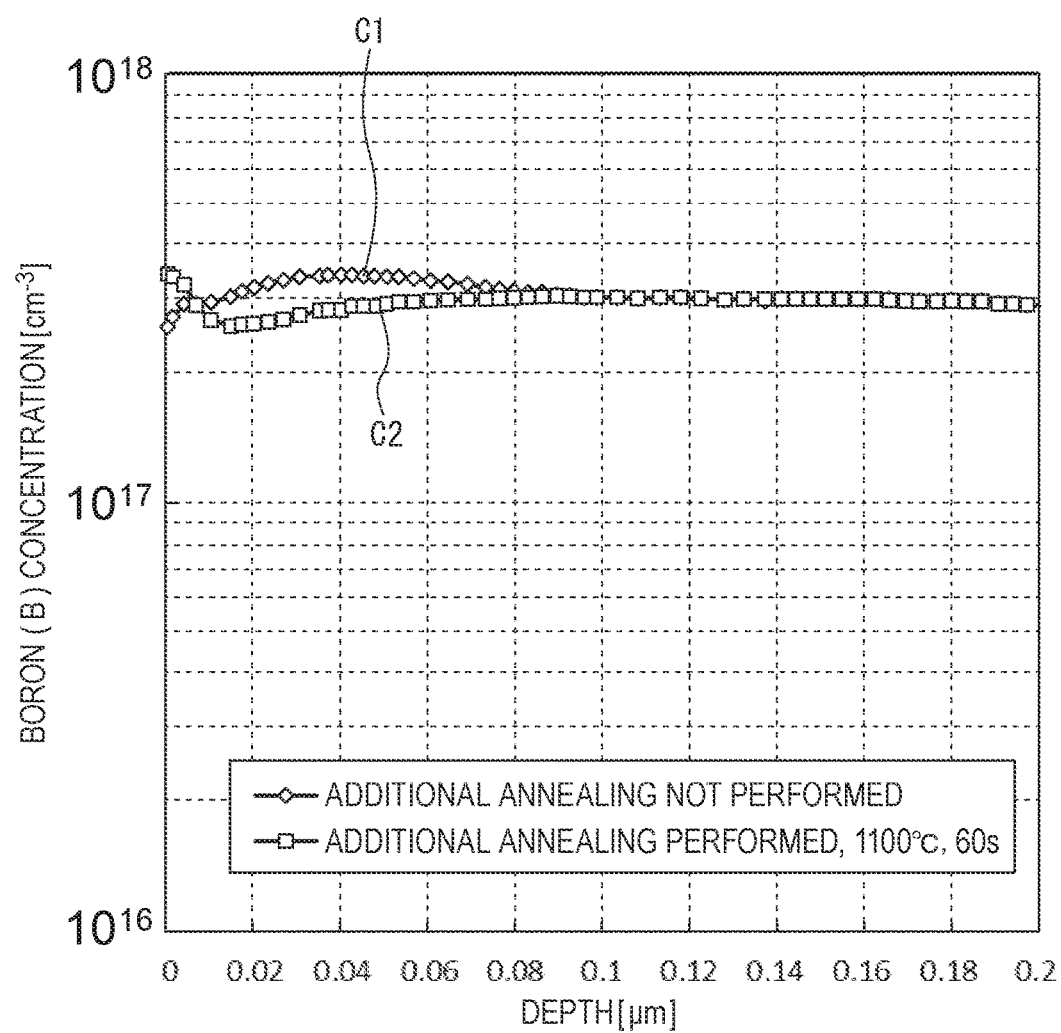
FIG. 17 is a graph illustrating the results of a simulation of investigating a depth-direction concentration distribution of boron in a channel region depending on whether or not additional lamp annealing is performed.

As can be seen from FIG. 13, unlike FIG. 17, indium does not pile up to the interface between the gate insulator 7 and the silicon substrate 2 (gate insulator/Si interface) by the additional annealing. In particular, as the heat treatment temperature increases and the heat treatment time increases, indium concentration near the gate insulator/Si interface decreases. Integration between the use of indium as the channel impurity and the additional annealing after the formation of the polysilicon film as the gate material can reduce the interface state density and can suppress TED at the same time, and is more effective than integration between the use of boron as the channel impurity and the additional annealing after the formation of the polysilicon film as the gate material from the viewpoint of 1/f noise characteristics.

In addition, the distance between the surface of the channel region 6 and the concentration peak position of indium is 20 nm to 70 nm in all the data A1 to A3.

Figure 14:
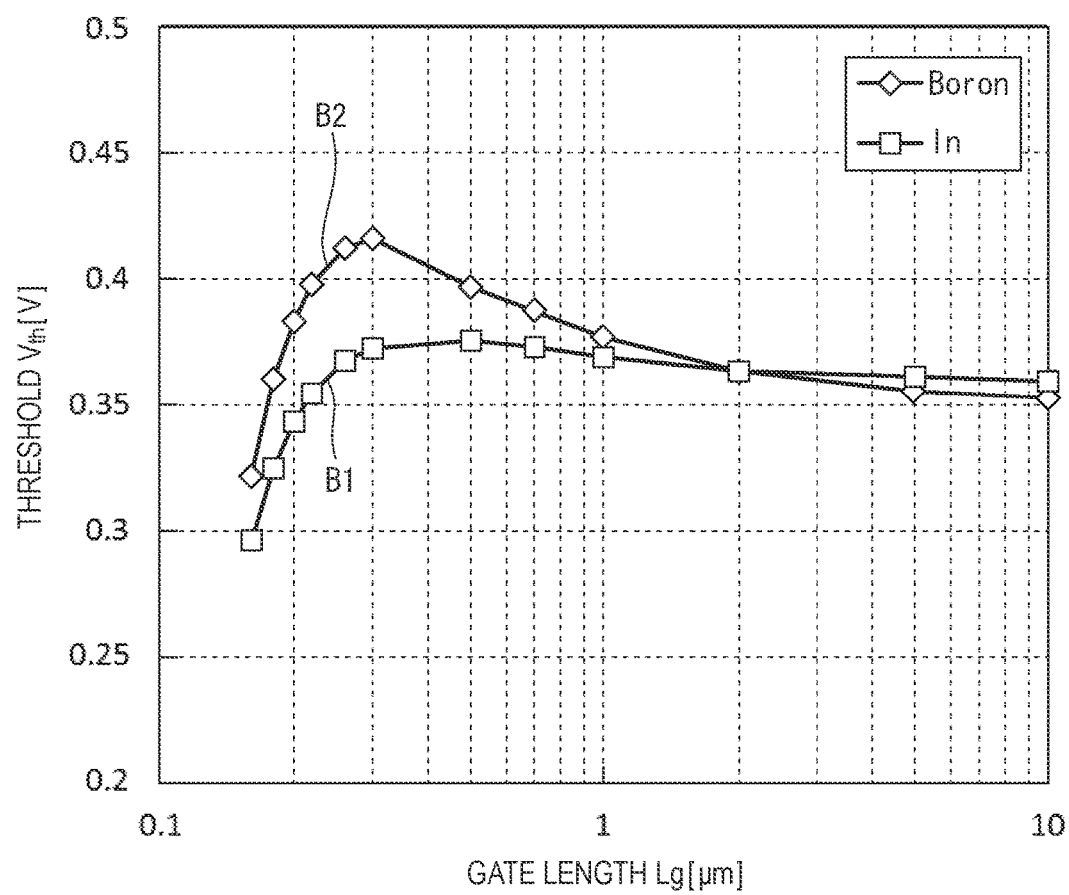
FIG. 14 is a graph illustrating the dependence of a threshold voltage Vth on a gate length Lg in a case where indium is used as a channel impurity and in a case where boron is used as a channel impurity to describe the semiconductor device according to the embodiment of the present invention and the method of manufacturing the same.

FIG. 14 is a graph illustrating the dependence of the threshold voltage Vth on the gate length Lg in a case where indium is used as a channel impurity (data B1) and in a case where boron is used as a channel impurity (data B2).

As can be seen from FIG. 14, in a case where indium is used as the channel impurity, an increase in threshold voltage at a short gate length is smaller and reverse short channel characteristics are lower than in a case where boron is used as the channel impurity. The results show that the channel impurity is not likely to pile up to edges of the extension regions 9 and 10.

Figure 15:
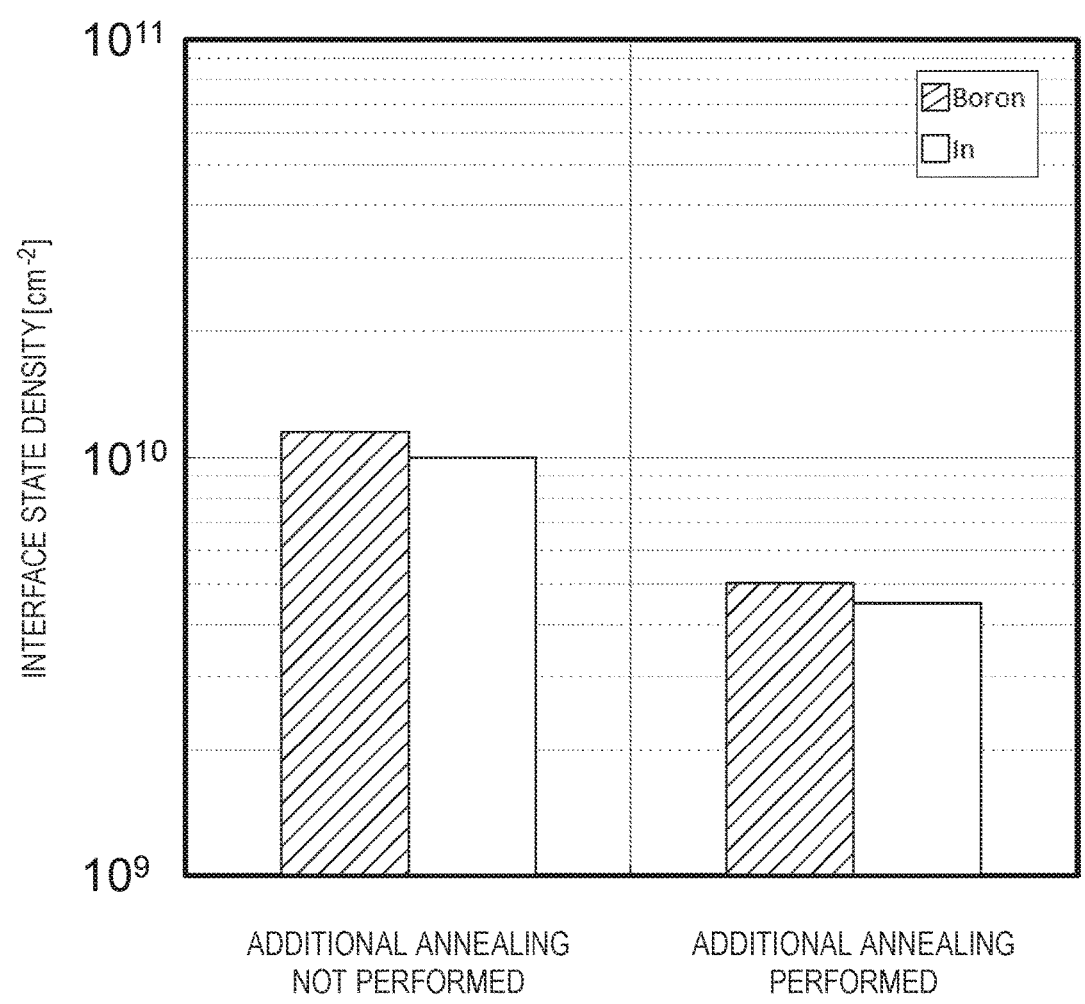
FIG. 15 is a graph illustrating the results of investigating an interface state density in a channel region in a case where boron is used as a channel impurity and in a case where indium is used as a channel impurity to describe the semiconductor device according to the embodiment of the present invention and the method of manufacturing the same.

FIG. 15 is a graph illustrating the results of investigating an interface state density in a case where boron is used as a channel impurity and in a case where indium is used as a channel impurity.

As can be seen from FIG. 15, the interface state density is reduced by additional annealing in all of the case where boron is used as a channel impurity and the case where indium is used as a channel impurity. Accordingly, by performing additional annealing, an interface state density of $1 \times 10^{10}$ $cm^{-2}$ or lower can be realized. In addition, under additional annealing conditions of 1100° C. and 60 seconds, an interface state density of $5 \times 10^9$ $cm^{-2}$ can be realized.

Figure 16:
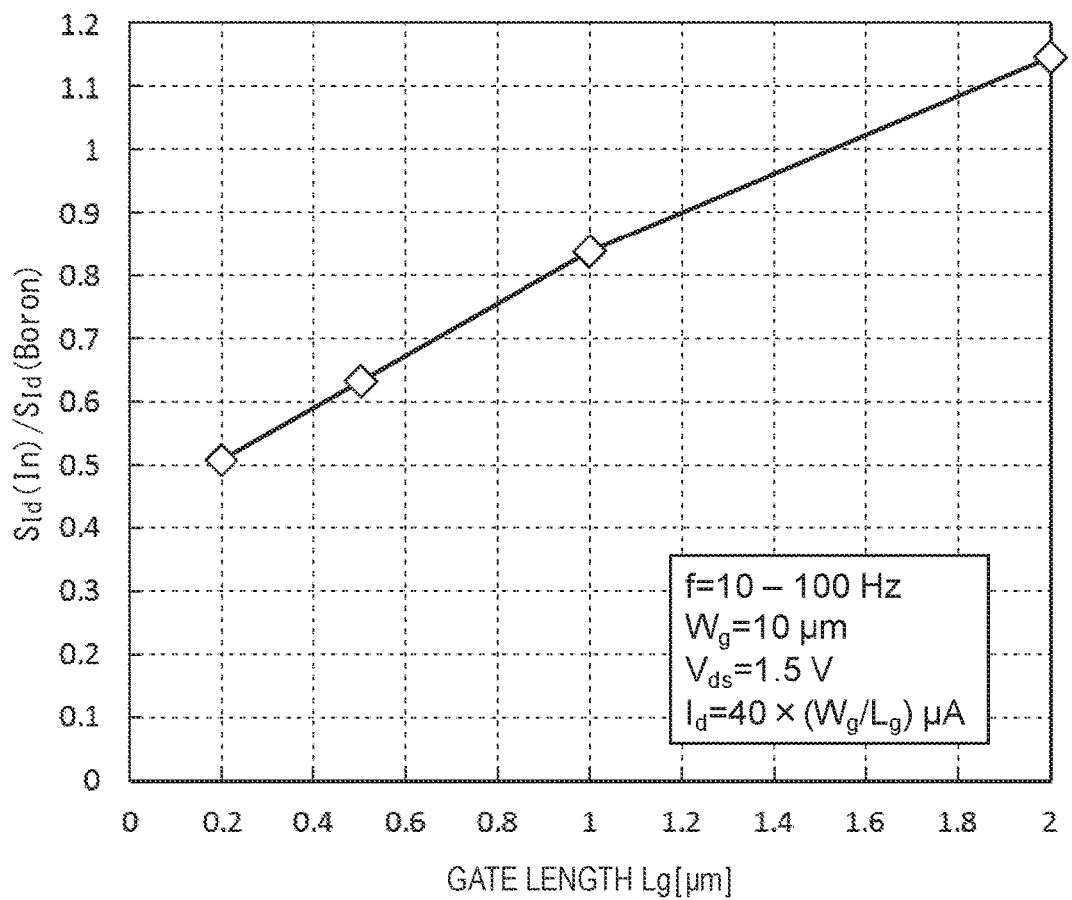
FIG. 16 is a graph illustrating the results of comparing 1/f noise characteristics to describe the semiconductor device according to the embodiment of the present invention and the method of manufacturing the same.

FIG. 16 is a graph illustrating the results of comparing 1/f noise characteristics. In the graph, the horizontal axis represents the gate length Lg, and the results of comparing the 1/f noise of a case where boron is used as a channel impurity and the 1/f noise of a case where indium is used as a channel impurity to each other are plotted.

As can be seen from FIG. 16, at a gate length Lg of 2 μm, in a case where indium is used as a channel impurity, deterioration in 1/f noise characteristics is more significant than that in a case where boron is used as a channel impurity. On the other hand, in a gate length Lg range of 1.5 μm or less, in a case where indium is used as a channel impurity, the 1/f noise is further reduced as compared to a case where boron is used as a channel impurity. The channel region 6 including indium has a retrograde distribution, and thus deterioration in subthreshold swing is more significant than that in the channel region including boron. This shows that a current path is likely to be narrow in the channel region 6 including indium, and the narrow current path has an adverse effect on 1/f noise characteristics. In a short channel element, an effect of the channel impurity concentration around an extension region edge is high. However, in the MOSFET-Qn with a gate length of shorter than 1.5 μm according to the embodiment, an effect of reduction of the channel impurity concentration near an extension region edge becomes larger than an effect of narrowing current paths, and thus 1/f noise characteristics are improved.

As described above, by using indium as the channel impurity and performing additional annealing after the formation of the polysilicon film as the gate material, the 1/f noise can be reduced in the MOSFET-Qn having a gate length Lg of 1.5 μm or less. The noise reduction effect becomes significant at a gate length Lg of 1 μm or less, and the reduction ratio is 37% at a gate length Lg of 0.5 μm and is 50% at a gate length Lg of 0.2 μm.

Accordingly, in the semiconductor device 1 according to the embodiment of the present invention and the method of manufacturing the same, the 1/f noise of the MOSFET-Qn can be reduced. In addition, an effect of noise on an analog circuit can be reduced.

In the embodiment, as the insulated gate field effect transistor, the semiconductor device 1 including the MOSFET-Qn in which the gate insulator is formed of a silicon dioxide film has been described. However, the present invention is not limited to the embodiment. As the insulated gate field effect transistor, a semiconductor device including a metal insulator semiconductor field effect transistor (MISFET) in which a gate insulator is formed of a silicon nitride film or a high-dielectric insulating film can also be used.

Hereinabove, the present invention has been described based on the embodiment. However, the present invention is not limited to the embodiment, and various modifications can be made within a range not departing from the scope of the present invention.

1: SEMICONDUCTOR DEVICE
2: SILICON SUBSTRATE
3: ELEMENT ISOLATION LAYER
4: THROUGH FILM
5: WELL REGION
5A: WELL IMPURITY ION IMPLANTATION REGION
6: CHANNEL REGION
6A: CHANNEL IMPURITY ION IMPLANTATION REGION
6B: CHANNEL IMPURITY LAYER
7: GATE INSULATOR
8: GATE ELECTRODE
9, 10: EXTENSION REGION
9A, 10A: EXTENSION IMPURITY ION IMPLANTATION REGION
11: SIDE WALL SPACER
12, 13: CONTACT REGION
12A, 13A: CONTACT IMPURITY ION IMPLANTATION REGION
14S: SOURCE REGION
15D: DRAIN REGION
16: SILICIDE LAYER

What is claimed is:

1. A semiconductor device comprising:
a well region provided on a surface layer of a semiconductor substrate;
a source region and a drain region disposed to be distant from each other on a surface layer of the well region;
a channel region provided between the source region and the drain region; and
a gate electrode provided over the channel region with a gate insulator interposed between the gate electrode and the channel region,
wherein a gate length of the gate electrode is 1.5 μm or less,
the channel region includes indium as a channel impurity,
a distance between a surface of the channel region and a concentration peak position of the channel impurity is 20 nm to 70 nm,
a concentration of the channel impurity gradually decreases in a direction from the concentration peak position of the channel impurity to the surface of the channel region, and
the semiconductor device is an n-channel MOSFET.

2. The semiconductor device according to claim 1, wherein an interface state density of the channel region is $3.0 \times 10^9$ cm$^{-2}$ or higher and lower than $1.0 \times 10^{10}$ cm$^{-2}$.

3. The semiconductor device according to claim 1, further comprising:
a side wall spacer provided on a side surface of the gate electrode; and
a silicide layer provided on a surface of each of the gate electrode, the source region, and the drain region.

4. The semiconductor device according to claim 2, further comprising:
a side wall spacer provided on a side surface of the gate electrode; and
a silicide layer provided on a surface of each of the gate electrode, the source region, and the drain region.

5. A method of manufacturing a semiconductor device comprising:
ion-implanting a well impurity into a surface layer of a semiconductor substrate;
implanting an indium ion as a channel impurity into the surface layer of the semiconductor substrate;
performing a first heat treatment on the semiconductor substrate into which the well impurity and the indium ion have been implanted;
forming a gate insulator on the surface layer of the semiconductor substrate on which the first heat treatment has been performed;
forming a polysilicon film on the gate insulator;
performing a second heat treatment on the semiconductor substrate on which the polysilicon film has been formed after the formation of the polysilicon film; and
forming a gate electrode having a gate length of 1.5 μm or less by ion-implanting a gate impurity into the polysilicon film, patterning the polysilicon film, and performing a third heat treatment on the semiconductor substrate.

6. The method of manufacturing a semiconductor device according to claim 5,
wherein the second heat treatment is performed at a temperature of 965° C. to 1125° C.

7. The method of manufacturing a semiconductor device according to claim 6,
wherein the second heat treatment is performed for 15 seconds to 60 seconds.

8. The method of manufacturing a semiconductor device according to claim 5, further comprising:
forming an extension region including an extension impurity by ion-implanting the extension impurity into the surface layer of the semiconductor substrate by using the gate electrode as a mask, and performing a fourth heat treatment;
forming a side wall spacer on a side surface of the gate electrode; and
forming a contact region including a contact impurity by implanting the contact impurity into the surface layer of the semiconductor substrate more deeply than the extension impurity by using the gate electrode and the side wall spacer as a mask, and performing a fifth heat treatment on the semiconductor substrate.

9. The method of manufacturing a semiconductor device according to claim 8, further comprising:
forming a silicide layer on a surface of each of the gate electrode and the contact region.

10. The method of manufacturing a semiconductor device according to claim 6, further comprising:
forming an extension region including an extension impurity by ion-implanting the extension impurity into the surface layer of the semiconductor substrate by using the gate electrode as a mask, and performing a fourth heat treatment;
forming a side wall spacer on a side surface of the gate electrode; and
forming a contact region including a contact impurity by implanting the contact impurity into the surface layer of the semiconductor substrate more deeply than the extension impurity by using the gate electrode and the side wall spacer as a mask, and performing a fifth heat treatment on the semiconductor substrate.

11. The method of manufacturing a semiconductor device according to claim 7, further comprising:
forming an extension region including an extension impurity by ion-implanting the extension impurity into the surface layer of the semiconductor substrate by using the gate electrode as a mask, and performing a fourth heat treatment;

forming a side wall spacer on a side surface of the gate electrode; and forming a contact region including a contact impurity by implanting the contact impurity into the surface layer of the semiconductor substrate more deeply than the extension impurity by using the gate electrode and the side wall spacer as a mask, and performing a fifth heat treatment on the semiconductor substrate.

* * * * *